United States Patent [19]
Mistry et al.

[11] Patent Number: 5,488,541
[45] Date of Patent: Jan. 30, 1996

[54] VME BUS COMPATIBLE BACKPLANE AND SHELF ARRANGEMENT

[75] Inventors: Balwantrai Mistry, Nepean; Raymond B. Wallace, Kanata, both of Canada

[73] Assignee: Northern Telecom Limited, Montreal, Canada

[21] Appl. No.: 251,994

[22] Filed: Jun. 1, 1994

[51] Int. Cl.$^6$ ............................. H01R 23/68; H05K 7/14
[52] U.S. Cl. .......................... 361/788; 361/785; 361/791; 361/796; 361/803; 439/61; 439/62
[58] Field of Search ..................................... 361/784, 785, 361/788, 791, 796, 797, 803; 439/61, 62; 324/158 F, 158.1; 364/708.1, 240, 240.2

[56] References Cited

U.S. PATENT DOCUMENTS

| | | | |
|---|---|---|---|
| 4,232,924 | 11/1980 | Kline et al. ................................ | 439/61 |
| 5,003,156 | 3/1991 | Kilpatrick et al. .................... | 324/158.1 |
| 5,023,754 | 6/1991 | Aug et al. ................................ | 361/788 |
| 5,031,075 | 7/1991 | Casanova et al. ...................... | 361/796 |
| 5,282,112 | 1/1994 | Bremer .................................... | 361/788 |
| 5,346,117 | 9/1994 | Kohn et al. ............................. | 228/180.22 |

FOREIGN PATENT DOCUMENTS 2-158158   6/1990   Japan ..................................... 361/799

OTHER PUBLICATIONS

IBM Technical Disclosure Bulletin "Double Board Arrangement" by Tsui et al. vol. 13 No. 6 Nov. 1970 pp. 1411 and 1412.

Primary Examiner—Donald A. Sparks
Attorney, Agent, or Firm—F. P. Turpin; Dallas F. Smith

[57] ABSTRACT

A VME Bus Compatible backplane and shelf arrangement is provided which incorporates a connectorized backplane arrangement which provides for direct mating to both industry standard VME bus cards as well as VME transition cards. A backplane is provided that is double-sided. On a first face, access to two VME busses (P1 & P2) is provided via rows of first and second connectors. The connector of each row are evenly spaced along the bus and the connectors of one row are vertically aligned with the connectors of the second row. On the second face a third row of connectors is provided, directly behind the second row with each connector offset with respect to a corresponding second connector. The first and second rows of connectors accept standard VME bus cards. The third connectors accept directly, industry standard transition cards. Some of the conductors in the second connectors are connected to the second bus, while others are connected directly to conductors in the third connectors.

4 Claims, 3 Drawing Sheets

5,488,541

VME BUS COMPATIBLE BACKPLANE AND SHELF ARRANGEMENT

The present invention relates to computer backplane arrangements and is particularly concerned with telecommunications applications thereof.

BACKGROUND TO THE INVENTION

It is well known in the computer industry to use a backplane bus arrangement with a plurality of circuit cards. Each circuit card plugging into a female connector mounted on one surface of the backplane. One such computer bus arrangement is the IEEE standard 1014–1987 VMEbus. The VMEbus is an industry standard multiprocessor system bus that uses a 32-bit address and data bus for communication between various VME cards. Because of the success of this standard and the availability of circuit cards for use therewith, it is highly desirable to use this standard in industries whose standard practices are at variance with those of the computer industry. In particular, the direct application of the VMEbus to telecommunication is hindered by industry guidelines on maintenance and safety, for example NEBS (BellCore TR-NWT 000063).

SUMMARY OF THE INVENTION

An object of the present invention is to provide an improved VME Bus compatible backplane and shelf arrangement.

In accordance with an aspect of the present invention there is provided a backplane for a computer comprising: a printed circuit board having first and second faces and first and second busses; a plurality of first connectors disposed upon the first face, distributed along the backplane at a substantially fixed interval spacing and connected to the first bus; a plurality of second connectors disposed upon the first face, distributed along the backplane at a spacing similar to the spacing of the first connectors, and connected to the second bus, each of the first and second connectors are substantially aligned across the backplane to define a respective slot; and a plurality of third connectors disposed upon the second face, distributed along the backplane at a spacing similar to the spacing of the second connectors, each third connector offset from a respective second connector along the backplane by approximately one-half the spacing of the respective second connector.

Advantages of the present invention are a simplified more space efficient shelf and bus arrangement which remain compatible with standardized cards and modules.

BRIEF DESCRIPTION OF THE DRAWINGS

The present invention will be further understood from the following description with reference to the accompanying drawings in which:

Referring to FIG. 1 there is illustrated in a block diagram a bus arrangement in accordance with the IEEE VMEbus standard. The VMEbus is an industry standard multiprocessor system bus that uses a 32 bit address and data bus for communication between various VME cards. The VME standard bus provides a maximum number of 21 VME card slots. The VMEbus includes two rows 10 and 12 of female connectors providing access to so-called VME P1 and VME P2 busses 14 and 16, respectively. The VMEbus backplane provides female connectors 10 and 12 on the front face for receiving standard VME cards in slots 1 through 21. The VMEbus also provides male connectors 18 on the back side of the backplane for each slot. Male connectors 18 are used to couple VME cards (not shown in FIG. 1) to corresponding transition cards via ribbon cables (not shown in FIG. 1 but indicated by arrows 19). The VME transition cards are used for the connection of the shelf to other systems through interfaces such as ethernet, and SCSI bus for disk drives.

Referring to FIG. 2 there is illustrated in a partial plan view, a known VMEbus backplane and shelf arrangement. A backplane 20 includes on its front face the plurality of female connectors 12 each for receiving a corresponding male connector 22 mounted on a respective circuit card 24. The circuits cards 24 each have faceplate 26 attached to the front edge thereof. Pins of female connectors 12 extend through the backplane 20 to form male connectors pins of male connector 18. Each card in a slot so provided can be connected to a transition card 28 via a male connector 30 and ribbon cable 32 having female connectors 34 and 36 at a respective end thereof.

For the computer industry the standard VMEbus arrangement is acceptable practice. However, other desired applications for the VMEbus may have in place restrictions that can not be accommodated by the standard VMEbus arrangement. For example, in the telecommunications industry compliance with industry guidelines such as NEBS (BellCore TR-NWT 000063) prevent the direct application of standard practices from other industries such as the computer industry.

Figure 3:
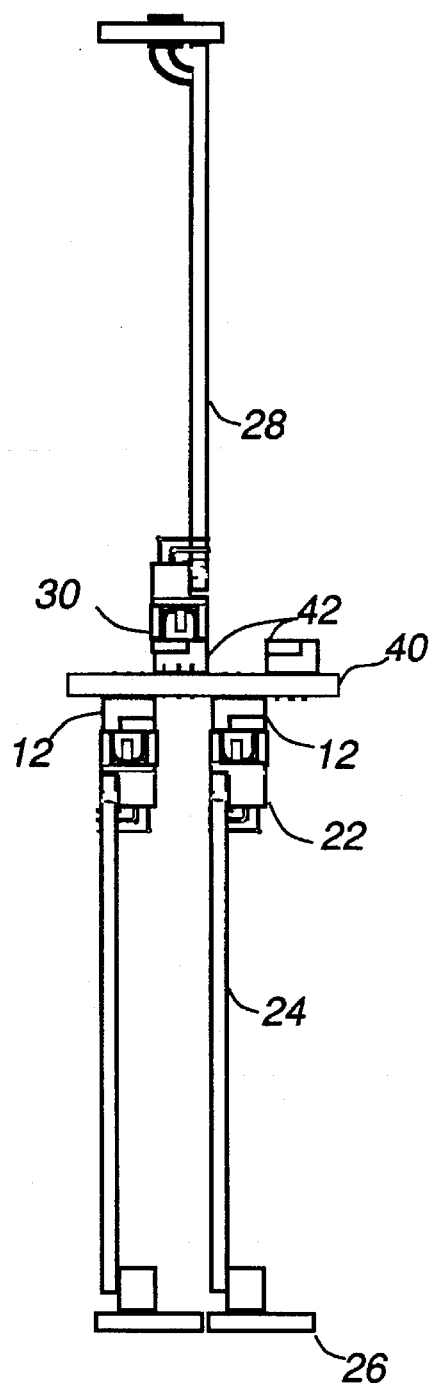
FIG. 3 illustrates in a partial plan view of a VMEbus backplane and shelf arrangement in accordance with an embodiment of the present invention.
Figure 2:
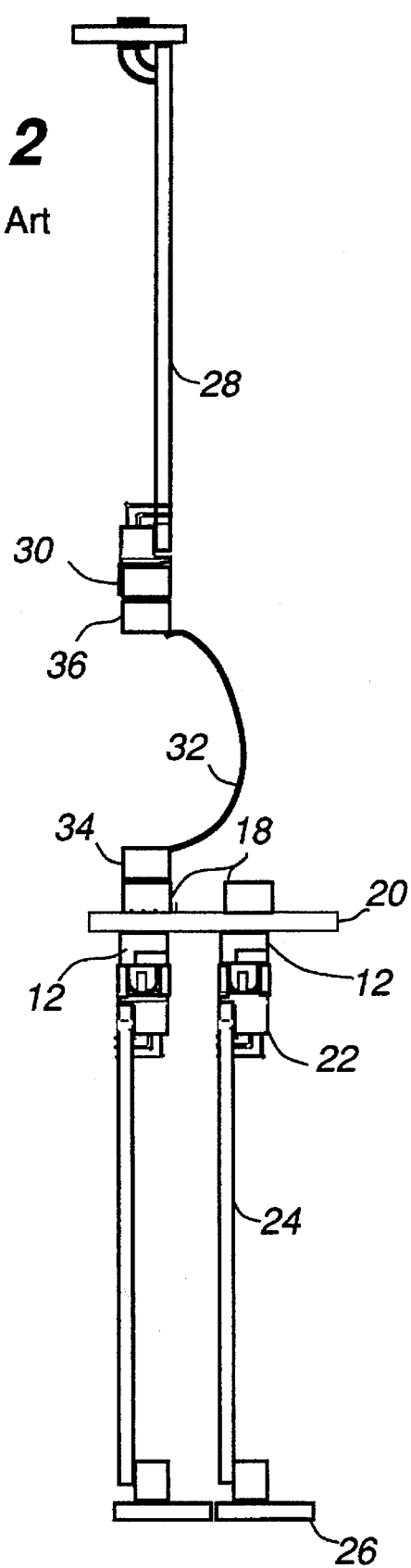
FIG. 2 illustrates in a partial plan view of a known VMEbus backplane and shelf arrangement.

Referring to FIG. 3 there is illustrated in a partial plan view a VMEbus backplane and shelf arrangement in accordance with an embodiment of the present invention. A backplane 40 includes, on its front face, the two rows of female connectors 10 and 12 which connect cards to the VME P1 and P2 busses as in FIG. 2. Because FIGS. 2 and 3 are plan views of the arrangements, only connectors 12 are shown. On the back of backplane 40 there is a row of female connectors 42 offset from and interconnected with corresponding female connectors 12. Typically, each of the 21 card connectors 12 is interconnected to a respective one of corresponding female connectors 42.

Figure 1:
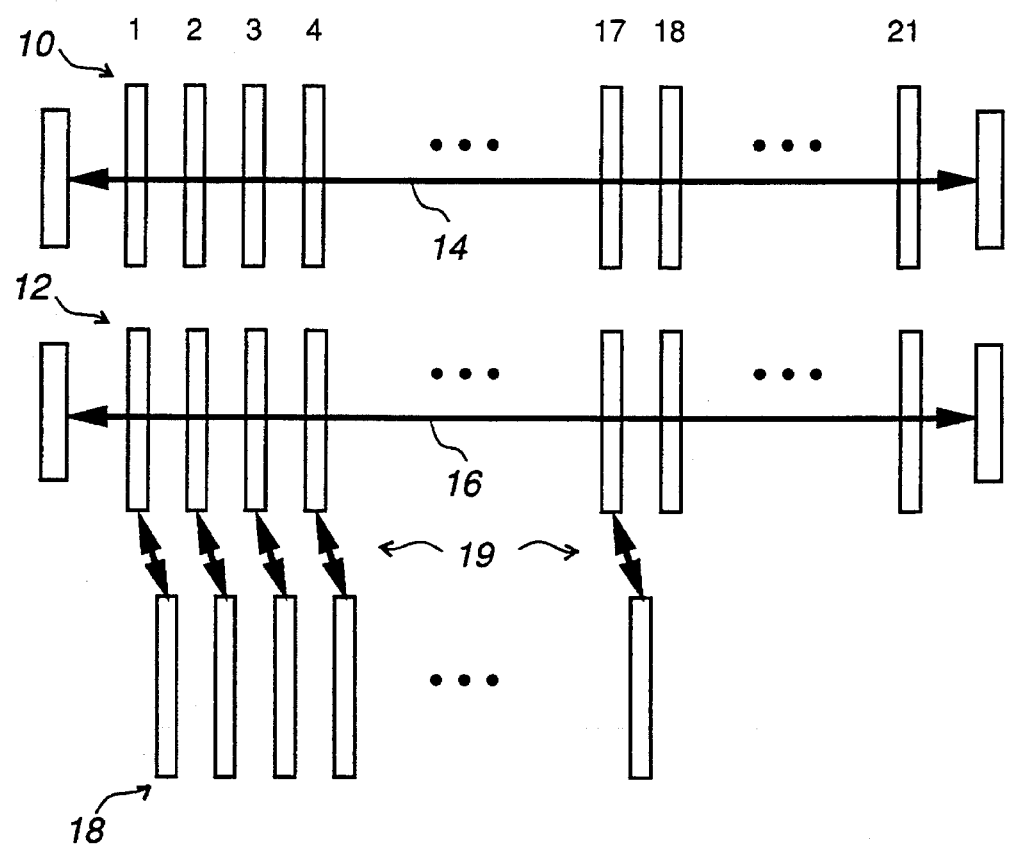
FIG. 1 illustrates in a block diagram a bus arrangement in accordance with the IEEE VMEbus standard.

The backplane 40 provides the backbone for all of the connectors that are used in the VMEbus system. Included therefore are two rows of 21 card connectors 10, 12 corresponding to respective VME busses P1 & P2 of FIG. 1 and the 17 transition card connectors 42 corresponding to the 17 male connectors 18 of FIG. 1. Transition card connectors 42 are connected directly via the backplane 40, to the first 17 VME P2 bus connectors 12.

Figure 4:
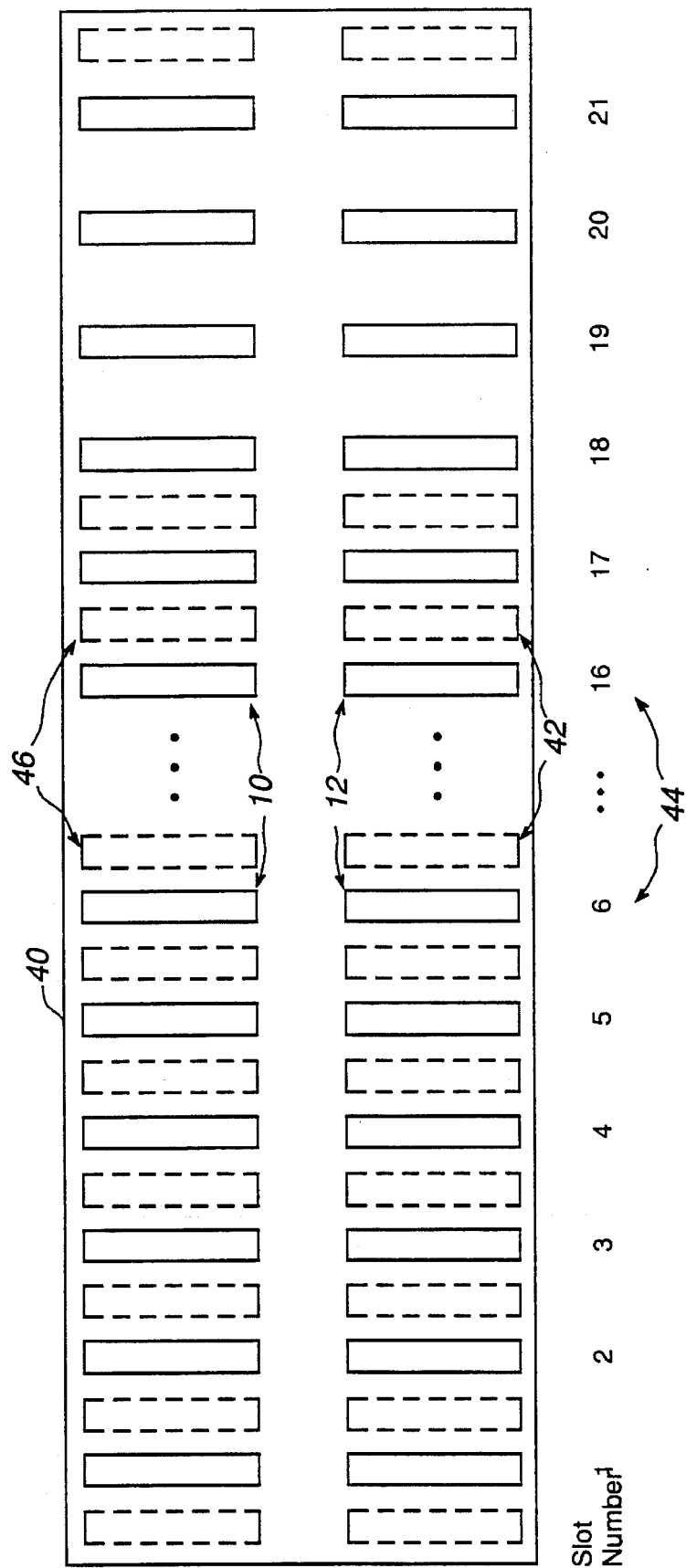
FIG. 4 illustrates in a plan view the backplane of FIG. 3.

Referring to FIG. 4 there is illustrated in a plan view the backplane of FIG. 3. Twenty one VME card slots 44 are defined by the placement and spacing of two rows of female connectors 10 and 12, on the front of the backplane 40. The two rows of female connectors 10 and 12 provide connection to the so-called VME P1 and P2 busses, respectively. Connectors on the back of backplane 40 are illustrated in broken line. These include the female connectors 42 for connection to the transition cards 28 and additional female connectors 46 for power connections to transition cards 28.

The 21 slot VMEbus is the primary bus on the backplane and it is connected between the 21 card slots on the bus. This bus is carried on 128 pins of two separate connectors as shown in Tables A and B. The VMEbus uses all 96 pins on the top connector referred to as the P1 connector in the VMEbus standards while it uses only the middle 32 pins (row B) of the second connector referred to as the P2 connector.

The signals on each of these connectors can be divided into three separate groups with regards to the tracking on the backplane between the connectors. These groups are: power and ground; bus signals; and daisy chain signals. The tracking of all these signals is performed according to the VMEbus standard referred to herein above.

The power and ground signals are all connected directly to the power and ground planes on the backplane at each of the pins.

The daisy chain signals include the 8 bus grant signals (BG0IN*, BG0OUT* through BG3IN* and BG3OUT*) that appear on row B of the P1 connector in Table A. Also the interrupt acknowledge (IACKIN* and IACKOUT*) signals that are on row A of the P1 connector. These five signals are connected to form a daisy chain across the bus with the OUT signal on one slot (slot n) connecting to the corresponding IN signal on the next slot (slot n+1).

TABLE A

VMEBUS P1 PIN DESIGNATIONS
(SLOTS 1–21)

| Pin Number | Row A | Row B | Row C |
|---|---|---|---|
| 1. | D00 | BBSY* | D08 |
| 2. | D01 | BCLR* | D09 |
| 3. | D02 | ACFAIL* | D10 |
| 4. | D03 | BG0IN* | D11 |
| 5. | D04 | BG0OUT* | D12 |
| 6. | D05 | BG1IN* | D13 |
| 7. | D06 | BG1OUT* | D14 |
| 8. | D07 | BG2IN* | D15 |
| 9. | GND | BG2OUT* | GND |
| 10. | SYSCLK | BG3IN* | SYSFAIL* |
| 11. | GND | BG3OUT* | BERR* |
| 12. | DS1* | BR0* | SYSRESET* |
| 13. | DS0* | BR1* | LWORD* |
| 14. | WRITE* | BR2* | AM5 |
| 15. | GND | BR3* | A23 |
| 16. | DTACK* | AM0 | A22 |
| 17. | GND | AM1 | A21 |
| 18. | AS* | AM2 | A20 |
| 19. | GND | AM3 | A19 |
| 20. | IACK* | GND | A18 |
| 21. | IACKIN* | SERCLK | A17 |
| 22. | IACKOUT* | SERDAT | A16 |
| 23. | AM4 | GND | A15 |
| 24. | A07 | IRQ7* | A14 |
| 25. | A06 | IRQ6* | A13 |
| 26. | A05 | IRQ5* | A12 |
| 27. | A04 | IRQ4* | A11 |
| 28. | A03 | IRQ3* | A10 |
| 29. | A02 | IRQ2* | A09 |
| 30. | A01 | IRQ1* | A08 |
| 31. | −12 VDC | +5 VSTBY | +12 VDC |
| 32. | +5 VDC | +5 VDC | +5 VDC |

TABLE B

VMEbus P2 pin designations
(Slots 1–20)

| Pin Number | Row A | Row B | Row C |
|---|---|---|---|
| 1. | User Defined | +5 VDC | User Defined |
| 2. | User Defined | GND | User Defined |
| 3. | User Defined | Reserved | User Defined |
| 4. | User Defined | A24 | User Defined |
| 5. | User Defined | A25 | User Defined |
| 6. | User Defined | A26 | User Defined |
| 7. | User Defined | A27 | User Defined |
| 8. | User Defined | A28 | User Defined |
| 9. | User Defined | A29 | User Defined |
| 10. | User Defined | A30 | User Defined |
| 11. | User Defined | A31 | User Defined |
| 12. | User Defined | GND | User Defined |
| 13. | User Defined | +5 VDC | User Defined |
| 14. | User Defined | D16 | User Defined |
| 15. | User Defined | D17 | User Defined |
| 16. | User Defined | D18 | User Defined |
| 17. | User Defined | D19 | User Defined |
| 18. | User Defined | D20 | User Defined |
| 19. | User Defined | D21 | User Defined |
| 20. | User Defined | D22 | User Defined |
| 21. | User Defined | D23 | User Defined |
| 22. | User Defined | GND | User Defined |
| 23. | User Defined | D24 | User Defined |
| 24. | User Defined | D25 | User Defined |
| 25. | User Defined | D26 | User Defined |
| 26. | User Defined | D27 | User Defined |
| 27. | User Defined | D28 | User Defined |
| 28. | User Defined | D29 | User Defined |
| 29. | User Defined | D30 | User Defined |
| 30. | User Defined | D31 | User Defined |
| 31. | User Defined | GND | User Defined |
| 32. | User Defined | +5 VDC | User Defined |

All VME cards that are used in the shelf must connect the daisy chain through the board from the IN to the OUT pin for each of the five signals regardless of whether the board uses the signal or not.

All other bus signals other than those mentioned above are connected directly from slot to slot across the bus. These connections must be made according to the VMEbus standard, which requires the total tracking distance be no greater than 20 inches.

All the VMEbus signals other than the power and ground pins must be tracked with 100 Ohm controlled impedance tracking. The slots are located at a spacing of 0.8".

The transition card slots are located on the back of the backplane 40 and are directly associated with slots on the primary side of the bus. These slots are provided in the backplane as shown in FIG. 4. These card slots are located at a spacing of 0.8" like the VME card slots except the card slots are offset by 0.4" so that the transition card connectors 42 and 46 are between the VME connectors 12 and 10, respectively.

The pin-out of the female connector 12 to the transition cards consists of the two 32-pin rows of user defined pins corresponding to the P2 VME connector 12. The connections to the transition card connectors 42 consist of tracking each of the 64 user defined pins between the VME card connector 12 and its associated transition card connector 42. The transition card slot associated with a VME card is located between the VME slot and the next higher slot in the VME backplane (i.e. the transition card for slot n is between VME slots n and n+1).

The user defined pins are not connected between the various slots in the VMEbus so that each slot has 64 pins dedicated for communication to transition cards attached to that slot. The female connector 42 for the transition cards is located directly between the P2 connectors on the VMEbus.

The tracking between the User defined pins is included on 100 Ohm impedance controlled planes for carrying the VMEbus signals.

At each transition card slot a second connector 46 is provided between the P1 row of connectors 10 with the pin-out shown in Table C. This connector is used for transition cards that require additional power from the VMEbus. The backplane provides connections for VMEbus terminators so that the VMEbus signals may be terminated at both ends of the bus to prevent reflections that will degrade the operation of the bus.

TABLE C

Transition Card Power Connector

| Pin Number | Row A | Row B | Row C |
|---|---|---|---|
| 1. | +5 VDC | GND | −12 VDC |
| 2. | +5 VDC | GND | −12 VDC |
| 3. | +5 VDC | GND | −12 VDC |
| 4. | +5 VDC | GND | −12 VDC |
| 5. | +5 VDC | GND | −12 VDC |
| 6. | +5 VDC | GND | −12 VDC |
| 7. | +5 VDC | GND | −12 VDC |
| 8. | +5 VDC | GND | −12 VDC |
| 9. | +5 VDC | GND | −12 VDC |
| 10. | +5 VDC | GND | −12 VDC |
| 11. | +5 VDC | GND | −12 VDC |
| 12. | +5 VDC | GND | −12 VDC |
| 13. | +5 VDC | GND | No Contact |
| 14. | +5 VDC | GND | No Contact |
| 15. | +5 VDC | GND | No Contact |
| 16. | +5 VDC | GND | No Contact |
| 17. | +5 VDC | GND | No Contact |
| 18. | +5 VDC | GND | No Contact |
| 19. | +5 VDC | GND | No Contact |
| 20. | +5 VDC | GND | No Contact |
| 21. | +5 VDC | GND | +12 VDC |
| 22. | +5 VDC | GND | +12 VDC |
| 23. | +5 VDC | GND | +12 VDC |
| 24. | +5 VDC | GND | +12 VDC |
| 25. | +5 VDC | GND | +12 VDC |
| 26. | +5 VDC | GND | +12 VDC |
| 27. | +5 VDC | GND | +12 VDC |
| 28. | +5 VDC | GND | +12 VDC |
| 29. | +5 VDC | GND | +12 VDC |
| 30. | +5 VDC | GND | +12 VDC |
| 31. | +5 VDC | GND | +12 VDC |
| 32. | +5 VDC | GND | +12 VDC |

Figure 5:
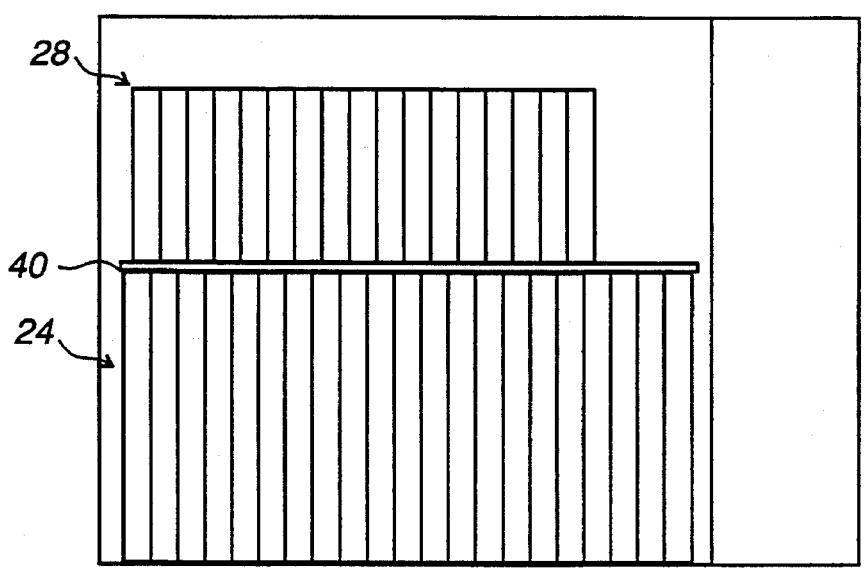
FIG. 5 illustrates in a plan view the shelf arrangement of FIG. 3.

Referring to FIG. 5, there is illustrated in a plan view the backplane and shelf arrangement of FIG. 3. For simplicity, FIG. 5 shows the VME circuit cards 24 and transition cards 28 as rectangles abutting the backplane 40. Each of the transition cards 28 is shown offset from the respective VME circuit card 28 by approximately one-half of the spacing of the VME circuit cards 28.

An additional advantage of the present invention is the compliance with Telecommunications' Industry Standards, for example, NEBS (BellCore TR-NEW 000063)) while remaining compatible with the IEEE VMEbus standard allowing the use of standard VME circuit cards and transition cards.

Numerous modifications, variations and adaptations may be made to the particular embodiments of the invention described above without departing from the scope of the invention, which is defined in the claims.

What is claimed is:

1. A VMEbus compatible backplane arrangement comprising:

a printed circuit board having first and second faces and first and second busses;

a plurality of first connectors disposed upon the first face, distributed along the backplane at a substantially fixed interval spacing and connected to the first bus;

a plurality of second connectors disposed upon the first face, distributed along the backplane at substantially the same spacing as that of the first connectors, and connected to the second bus, each corresponding located pair of the first and second connectors being suitably aligned across the backplane for receiving a respective VMEbus circuit card:

a plurality of third connectors mounted on the second face for directly receiving respective VMEbus transition cards, and each third connector being mounted at a location laterally intermediate a pair of second connectors; and each second connector having a first plurality of terminals connected to the second bus, and a second plurality of terminals connected to a selected third connector.

2. A VMEbus compatible backplane arrangement as claimed in claim 1 and further comprising a plurality of fourth connectors, each fourth connector having terminals connected directly to a backplane power bus for providing additional power directly from the backplane to the transition cards, each fourth connector being mounted on the second face at a location laterally intermediate a pair of first connectors, corresponding ones of the third and fourth connectors being substantially aligned across the backplane for receiving a respective VMEbus transition card.

3. A VMEbus compatible backplane arrangement as claimed in claim 1 or claim 2 and further comprising connector means for receiving VMEbus termination cards.

4. A VMEbus compatible backplane and shelf arrangement comprising:

a printed circuit board having first and second faces and first and second busses;

a plurality of first connectors disposed upon the first face, distributed along the backplane at a substantially fixed interval spacing and connected to the first bus;

a plurality of second connectors disposed upon the first face, distributed along the backplane at substantially the same spacing as that of the first connectors, and connected to the second bus, each corresponding located pair of the first and second connectors being suitably aligned across the backplane for receiving a respective VMEbus circuit card;

a plurality of third connectors mounted on the second face for directly receiving respective VMEbus transition cards, and each third connector being mounted at a location laterally intermediate a pair of second connectors;

each second connector having a first plurality of terminals connected to the second bus, and a second plurality of terminals connected to a selected third connector; and shelf means for supporting and guiding VMEbus circuit cards and transition cards into respective first second and third connectors.

\* \* \* \* \*